US009777367B2

(12) United States Patent
Paseuth et al.

(10) Patent No.: US 9,777,367 B2
(45) Date of Patent: Oct. 3, 2017

(54) SURFACE COATED MEMBER AND METHOD FOR MANUFACTURING SAME

(71) Applicant: Sumitomo Electric Hardmetal Corp., Itami-shi (JP)

(72) Inventors: Anongsack Paseuth, Itami (JP); Kazuo Yamagata, Itami (JP); Susumu Okuno, Itami (JP); Hideaki Kanaoka, Itami (JP); Hiroyuki Morimoto, Itami (JP); Minoru Itoh, Sorachi-gun (JP)

(73) Assignee: Sumitomo Electric Hardmetal Corp., Itami-shi (JP)

( * ) Notice: Subject to any disclaimer, the term of this patent is extended or adjusted under 35 U.S.C. 154(b) by 0 days.

(21) Appl. No.: 14/654,924

(22) PCT Filed: Nov. 1, 2013

(86) PCT No.: PCT/JP2013/079700
§ 371 (c)(1),
(2) Date: Jun. 23, 2015

(87) PCT Pub. No.: WO2014/103507
PCT Pub. Date: Jul. 3, 2014

(65) Prior Publication Data
US 2015/0345012 A1   Dec. 3, 2015

(30) Foreign Application Priority Data

Dec. 28, 2012  (JP) ................................. 2012-287500

(51) Int. Cl.
*C23C 16/34*   (2006.01)
*C23C 16/32*   (2006.01)
(Continued)

(52) U.S. Cl.
CPC .............. *C23C 16/32* (2013.01); *C23C 16/30* (2013.01); *C23C 16/34* (2013.01); *C23C 16/38* (2013.01);
(Continued)

(58) Field of Classification Search
USPC ............ 427/255, 255.28; 428/697, 698, 699, 428/701, 702, 704; 118/715, 723
See application file for complete search history.

(56) References Cited

U.S. PATENT DOCUMENTS 5,503,912 A * 4/1996 Setoyama ........... C03C 17/3435
428/697
5,700,551 A * 12/1997 Kukino ............... C04B 35/5831
427/419.1
(Continued)

FOREIGN PATENT DOCUMENTS

CA    2613091 A1    1/2007
CN    101090789 A   12/2007
(Continued)

OTHER PUBLICATIONS

Heim et al "TiAlN and TiAlN depostion in an industrial PaCVD PLant" Surface & Coatings 98 (1998) p. 1553-1556.*
(Continued)

*Primary Examiner* — Archene Turner
(74) *Attorney, Agent, or Firm* — Venable LLP; Michael A. Sartori; Miguel A. Lopez (57) ABSTRACT

A surface coated member having improved stability and a longer service life is provided. The surface coated member of the present invention includes a base member and a hard coating formed on a surface thereof. The hard coating is constituted of one or more layers. At least one of the layers is formed by a CVD method and includes a multilayer structure having a first unit layer and a second unit layer
(Continued)

being layered alternately. The first unit layer includes a first compound containing Ti and one or more kind of element selected from the group consisting of B, C, N, and O. The second unit layer includes a second compound containing Al and one or more kind of element selected from the group consisting of B, C, N, and O.

4 Claims, 2 Drawing Sheets

(51) Int. Cl.
    *C23C 16/455*     (2006.01)
    *C23C 16/38*     (2006.01)
    *C23C 16/30*     (2006.01)
    *C23C 28/04*     (2006.01)

(52) U.S. Cl.
    CPC .......... *C23C 16/455* (2013.01); *C23C 28/042* (2013.01); *C23C 28/044* (2013.01)

(56) References Cited

U.S. PATENT DOCUMENTS

| | | | |
|---|---|---|---|
| 6,040,012 A * | 3/2000 | Anderbouhr | C23C 16/34 427/255.391 |
| 6,089,472 A * | 7/2000 | Carter | C23C 16/455 239/424 |
| 6,333,099 B1 | 12/2001 | Strondl et al. | |
| 7,767,320 B2 * | 8/2010 | Endler | C23C 16/34 427/255.23 |
| 2004/0040502 A1 * | 3/2004 | Basceri | C23C 16/45514 118/715 |
| 2008/0292905 A1 | 11/2008 | Okada et al. | |
| 2009/0123779 A1 | 5/2009 | Endler | |
| 2011/0003126 A1 | 1/2011 | Van Den Berg et al. | |
| 2014/0124564 A1 * | 5/2014 | Moriguchi | B23K 20/1255 228/114.5 |
| 2015/0064452 A1 | 3/2015 | Pitonak et al. | |

FOREIGN PATENT DOCUMENTS

| | | |
|---|---|---|
| CN | 104582881 A | 4/2015 |
| EP | 0709483 A2 | 5/1996 |
| EP | 2700460 A1 | 2/2014 |
| EP | 2891536 A1 | 7/2015 |
| JP | S60-258462 A | 12/1985 |
| JP | H06-173009 A | 6/1994 |
| JP | 07-205362 A | 8/1995 |
| JP | 08-118163 A | 5/1996 |
| JP | H08-134629 A | 5/1996 |
| JP | 2001-513709 A | 9/2001 |
| JP | 2003-225808 A | 8/2003 |
| JP | 2007-168032 A | 7/2007 |
| JP | 4114854 B2 | 7/2008 |
| JP | 2008-545063 A | 12/2008 |
| JP | 5027491 B2 | 9/2012 |
| WO | WO-2012/144574 A1 | 10/2012 |
| WO | 2012/172895 * | 12/2012 |
| WO | WO-2013/134796 A1 | 9/2013 |
| WO | WO-2014/034730 A1 | 3/2014 |

OTHER PUBLICATIONS

International Search Report in PCT International Application No. PCT/JP2013/079700, dated Dec. 10, 2013.
Notification of the First Office Action in Chinese Patent Application No. 2013800683736, dated Jun. 3, 2016.
Extended European Search Report in European Patent Application No. 13868993.0, dated Jul. 6, 2016.
Notice of Grounds of Rejection in counterpart Japanese Patent Application No. 2012-287500, dated Jan. 31, 2017.
Notification of Second Office Action in counterpart Chinese Patent Application No. 201380068373.6, dated Jan. 26, 2017.

* cited by examiner

SURFACE COATED MEMBER AND METHOD FOR MANUFACTURING SAME

TECHNICAL FIELD

The present invention relates to a surface coated member including a base member and a hard coating formed on a surface thereof, and a method for manufacturing the same.

BACKGROUND ART

As a recent technical trend, producing a thinner and shorter surface coated member for a cutting tool or the like is on the main stream for the purpose of reducing a load on a global environment and efficiently utilizing a resource. Accordingly, providing a metal material having a higher strength and higher hardness used for a surface coated member is proceeding to secure a service life of a surface coated member and maintain its reliability. On the other hand, at metal working sites, it has been strongly requested to achieve improved accuracy of a worked part and reduced working cost to compete with newly emerging countries. Further, with the improvement in the performance of machining tools, the expectation for further high-speed working with a surface coated member is increasing. In the high-speed working, since a cutting edge of a surface coated member is exposed to a high-temperature and high-pressure environment, a surface coated member capable of having a longer service life even under a harsh environment will be requested in the future.

For example, Japanese Patent Laying-Open No. 7-205362 (PTD 1) discloses a hard coating which coats a surface of a base member of a surface coated member. In the hard coating, the composition thereof is changed continuously with nitride, carbide, carbonitride, or boride of two or more kinds of elements selected from group 4, 5, 6 elements, Al, and Si at a cycle of 0.4 nm to 50 nm. The above-described hard coating is formed by a PVD (Physical Vapor Deposition) method. Specifically, TiN layers and AlN layers are formed continuously on a base material surface with use of solid Ti, solid Al, and N2 gas by bringing Ti ion and Al ion, which are generated by a vacuum discharge, and N2 gas to be in contact with a base member heated to 500° C. Since the hard coating formed by this method has a large distortion in its structure, a surface coated member having this hard coating can have a superior wear resistance and toughness.

Moreover, for example, Japanese National Patent Publication No. 2008-545063 (PTD 2) discloses a member having a $Ti_{1-x}Al_xN$ coating as a surface coated member. This $Ti_{1-x}Al_xN$ coating has a single layer structure of a cubic crystal NaCl structure having a stoichiometric coefficient of $0.75 < x \leq 0.93$ and having a lattice constant afcc of 0.412 nm to 0.405 nm. The above-described $Ti_{1-x}Al_xN$ coating is formed by a CVD (Chemical Vapor Deposition) method. Specifically, a first gas mixture constituted of $AlCl_3$, $TiCl_4$, $H_2$, and argon and a second gas mixture constituted of $NH_3$ and $N_2$ as a nitrogen source are introduced into a CVD reactor vessel of a hot wall type accommodating a base member to perform a thermal CVD method. The above-described coating formed by this method has a higher Al content in the coating as compared to the $Ti_{1-x}Al_xN$ coating produced by a generally known PVD method. Therefore, a surface coated member having this coating has a higher oxidation resistance and a higher hardness and can exhibit a superior wear resistance at a high temperature.

CITATION LIST

Patent Document

PTD 1: Japanese Patent Laying-Open No 7-205362
PTD 2: Japanese National Patent Publication No 2008-545063

SUMMARY OF INVENTION

Technical Problem

However, as to PTD 1, there is a case where the hard coating formed by the PVD method contains impurities such as metals of Ti, Al, and alloy of those. Such impurities are referred to as droplets, which inhibit formation of the hard coating and causes falling of the hard coating during metal working. Moreover, from the part where the hard coating has fallen as a starting point, chipping, fracture, and the like of the hard coating is likely to occur. Consequently, it becomes difficult to obtain a longer service life of a surface coated member, and there is a case where the work quality and surface roughness of the work material are deteriorated.

Moreover, as to PTD 2, although the $Ti_{1-x}Al_xN$ coating has a stoichiometric coefficient of $0.75 < x \leq 0.93$, generally, there is a tendency to cause a large distortion in a crystal structure when x is greater than 0.7 in this composition. It is well known that a $Ti_{1-x}Al_xN$ crystal of a cubic crystal NaCl structure is modified into a hexagonal crystal wurzite structure to mitigate the distortion. Particularly, there is a tendency that this modification is accelerated at a high temperature.

During the metal working, a surface coated member and a work material repeat contact and release, and a load is applied to a surface of a cutting edge of the surface coated member in the cycles of heating and cooling. Therefore, a great thermal shock is applied all the time to the surface coated member during the metal working, and a thermal fatigue occurs. This thermal fatigue accelerates the above-described modification. Further, along with the repeated cutting, the hard coating which has once modified is likely to cause chipping and fracture. Therefore, also in the technique disclosed in PTD 2, there is a limit on a longer service life of a surface coated member in a high-speed working.

The present invention was made in view of the circumstance described above, and its object is to provide improved stability and a longer service life to a surface coated member and to provide a method for manufacturing the same.

Solution to Problem

The present invention concerns a surface coated member including a base member and a hard coating formed on a surface thereof. The hard coating is constituted of one or more layers. At least one layer among the layers is formed by a CVD method and includes a multilayer structure having a first unit layer and a second unit layer being layered alternately. The first unit layer includes a first compound containing Ti and one or more kind of element selected from the group consisting of B, C, N, and O. The second unit layer includes a second compound containing Al and one or more kind of element selected from the group consisting of B, C, N, and O.

In the above-described surface coated member, preferably, an intermediate layer is included between the first unit layer and the second unit layer. A composition of the intermediate layer changes continuously in its thickness direction from a composition of the first compound to a composition of the second compound.

In the above-described surface coated member, preferably, the first compound has an fcc-type crystal structure, and the second compound has an hcp-type crystal structure.

In the above-described surface coated member, preferably, the first compound further contains Al.

Moreover, the present invention concerns a method for manufacturing a surface coated member including a base member and a hard coating formed on a surface thereof and constituted of one or more layers. The method includes a CVD step of forming at least one layer among the layers by a CVD method. The CVD step includes a first step of ejecting first gas containing Ti and one or more kind of element selected from the group consisting of B, C, N, and O to a surface of the base member, and a second step of ejecting second gas containing Al and one or more kind of element selected from the group consisting of B, C, N, and O to a surface of the base member.

The first step and the second step are repeated alternately.

In the above-described manufacturing method, preferably, the first gas contains one or more kind selected from the group consisting of $N_2$, $NH_3$, and $N_2H_4$.

In the above-described manufacturing method, preferably, the second gas contains one or more kind selected from the group consisting of $N_2$, $NH_3$, and $N_2H_4$.

In the above-described manufacturing method, preferably, the first gas further contains Al.

Advantageous Effects of Invention

According to the surface coated member of the present invention, various characteristics such as the wear resistance, the welding resistance, and the thermal shock resistance are improved, so that the surface coated member can have improved stability and a longer service life. Moreover, according to the method for manufacturing a surface coated member of the present invention, various characteristics such as the wear resistance, the welding resistance, and the thermal shock resistance are improved, so that a surface coated member having improved stability and a longer service life can be manufactured.

DESCRIPTION OF EMBODIMENTS

Hereinafter, a surface coated member of the present invention will be described in detail with reference to the first embodiment, and a method for manufacturing a surface coated member of the present invention will be described with reference to the second embodiment and the third embodiment.

<<First Embodiment>>
<Surface Coated Member>

A surface coated member of the present invention has a configuration including a base member and a hard coating formed on a surface thereof. Preferably, such a hard coating coats an entire surface of the base member. However, even when a part of the base member is not coated with this hard coating, or a configuration of the hard coating is partially different, it does not depart from the scope of the present invention Examples of such a surface coated member of the present invention include a cutting tool, a wear resistant tool, a mold component, an automobile part, and the like. Among those, the surface coated member can be suitably used as a cutting tool such as a drill, an end mill, a cutting edge replaceable-type cutting tip for a drill, a cutting edge replaceable-type cutting tip for an end mill, a cutting edge replaceable-type cutting tip for milling, a cutting edge replaceable-type cutting tip for turning, a metal saw, a gear cutting tool, a reamer, a tap, or the like.

<Base Member>

The base member used in the surface coated member of the present invention can be anything as long as it has been conventionally known as a base member of this kind. For example, it is preferable that the base member is made of any of cemented carbide (for example, WC-base cemented carbide or a material containing WC and Co or carbonitride of Ti, Ta, Nb, or the like), a cermet (mainly composed of TiC, TiN, TiCN, or the like), a high-speed steel, a ceramic material (titanium carbide, silicon carbide, silicon nitride, aluminum nitride, aluminum oxide, and the like), a cubic crystal boron nitride sintered body, and a diamond sintered body.

Among those various kinds of base members, it is particularly preferable to select WC-based cemented carbide or a cermet (particularly, TiCN-base cermet). This is because these base members are particularly superior in balance between a hardness and a strength at a high temperature and have superior characteristics as a base member of a surface coated member for the above-described application.

It should be noted that, when the surface coated member is a cutting edge replaceable-type cutting tip or the like, such a base member includes the one having a chip breaker and the one having no chip breaker, and cutting-edge ridgeline portion has a shape including a sharp edge (a ridge at which a cutting face and a flank intersect), a honing (the one having an R shape given to a sharp edge), a negative land (the beveled one), and a combination of the honing and negative land.

<Hard Coating>

The hard coating of the present invention is constituted of one ore more layers, and at least one layer among the layers is formed by a CVD method and includes a multilayer structure having a first unit layer and a second unit layer being layered alternately. The hard coating of the present invention may include other layers as long as the hard coating includes at least one layer including the above-described multilayer structure. Other layers may include, for example, an $Al_2O_3$ layer, a $TiB_2$ layer, a TiBN layer, an AlN layer (wurtzite type), a TiN layer, a TiCN layer, a TiBNO layer, a TiCNO layer, a TiAlN layer, a TiAlCN layer, a TiAlON layer, a TiAlONC layer, and the like.

For example, adhesion between the base member and the hard coating can be improved by including the TiN layer, TiC layer, TiCN layer, or TiBN layer as a base layer directly above the base member. Moreover, the oxidation resistance of the hard coating can be improved by including the $Al_2O_3$ layer. Moreover, including an outermost layer made of the TiN layer, TiC layer, TiCN layer, TiBN layer, or the like can provide a distinctive characteristic on whether or not the cutting edge of the surface coated member is used. It should be noted that, in the present invention, when the composition of each layer constituting the hard coating is expressed by the chemical formula such as "TiN" and "TiCN," the chemical formula not particularly specifying an atomic ratio does not indicate that the atomic ratio of each element is only "1" but includes all of the conventionally known atomic ratio.

The hard coating of the present invention preferably has a thickness of 3 to 30 µm. When the thickness is less than 3 µm, there is a case where the wear resistance is insufficient. When the thickness exceeds 30 µm, there is a case where peeling or breaking of the hard coating frequently occurs due to a great stress applied to the hard coating and the base member during the intermittent working. It should be noted that other layer, which is other than the layer including the multilayer structure of the present invention, can be typically formed with a thickness of 0.1 to 10 µm.

<Layer Including Multilayer Structure>

The hard coating of the present invention is constituted of one or more layers. At least one layer among the layers is formed by a CVD method and includes a multilayer structure having a first unit layer and a second unit layer being layered alternately. In the layer including the multilayer structure (hereinafter, also referred to as "multilayer structure including layer"), the first unit layer includes a first compound containing Ti and one or more kind of element selected from the group consisting of B, C, N, and O, and the second unit layer includes a second compound containing Al and one or more kind of element selected from the group consisting of B, C, N, and O.

Specifically, the first compound may be TiC, TiN, TiCN, TiNO, TiCNO, $TiB_2$, $TiO_2$, TiBN, TiBNO, TiCBN, or the like, and the second compound may be $Al_2O_3$, AlN, AlCN, AlCNO, AlNO, or the like. The first compound containing Ti has a high hardness, and the second compound containing Al has a superior sliding characteristic.

In the present invention, the cause of improvement in various characteristics such as the wear resistance, the welding resistance, the thermal shock resistance, and the like by coating the base member with the multilayer structure including layer is not clear, but the following cause is presumed. In other words, in the multilayer structure including layer, the composition constituting each layer is drastically changed between the first unit layer and the second unit layer, so that a large distortion is accumulated in the structure. Further, as compared to the $Ti_{1-x}Al_xN$ coating having even composition disclosed in PTD 2, it can be present as a thermally stable layer, a modification due to a thermal shock is less likely to occur. Thus, in the multilayer structure including layer of the present invention, occurrence of chipping, fracture, or the like due to the modification is suppressed, and the high hardness of the first compound and the high sliding characteristic of the second compound can be maintained sufficiently Consequently, various characteristics such as the wear resistance, welding resistance, thermal shock resistance, and the like in the surface coated member of the present invention are improved.

The multilayer structure including layer of the present invention preferably has a thickness greater than or equal to 0.5 µm and less than or equal to 20 µm, more preferably greater than or equal to 2 µm and less than or equal to 18 µm. When the thickness is less than 0.5 µm, there is a case where the wear resistance is insufficient. When the thickness exceeds 20 µm, there is a case where a superior characteristic as a hard layer is lost because the distortion between the unit layers is alleviated. It should be noted that, even when the multilayer structure including layer partially includes a configuration other than the multilayer structure, for example, a configuration such as an amorphous phase, $Ti_{1-x}Al_xN$ ($0 \leq x \leq 1$) having an fcc type crystal structure, or the like, it does not depart from the scope of the present invention as long as the effect of the present invention is exhibited.

In the multilayer structure of the above-described multilayer structure including layer, the thickness of its layer cycle is preferably greater than or equal to 20 nm and less than or equal to 500 nm, more preferably greater than or equal to 100 nm and less than or equal to 300 nm. It is difficult to set the layer cycle to be less than 20 nm in the sense of manufacturing technique. When the layer cycle exceeds 500 nm, the adhesion strength between the first unit layer and the second unit layer is lowered to cause peeling, so that the above-described various characteristics are deteriorated. It should be noted that the above-described adhesion strength becomes higher as the thickness of each of the first unit layer and second unit layer is made smaller. However, it is difficult to set the thickness of each layer to be less than or equal to 0.01 µm in the sense of manufacturing technique.

Herein, the thickness of the layer cycle represents a distance from one first unit layer to other adjacent first unit layer across the second unit layer adjacent to the one first unit layer (when an intermediate layer described later is included between the first unit layer and the second unit layer, the intermediate layer adjacent to the second unit layer is included). It should be noted that this distance is a distance connecting midpoints of each of the first unit layer and the other first unit layer in the thickness direction of each layer.

It should be noted that the number of layers (the total number of layers) constituting the multilayer structure including layer is not particularly limited but is preferably greater than or equal to 10 layers and less than or equal to 1000 layers. This is because, when the number of layers is less than 10 layers, each layer becomes coarse and large, so that there is a case where the hardness of the multilayer structure including layer is lowered, and it shows a tendency that each layer becomes thinner when the number exceeds 1000 layers and each of the layers is mixed.

Moreover, the multilayer structure including layer of the present invention can include an intermediate layer between the first unit layer and the second unit layer. The composition of this intermediate layer is continuously changed in its thickness direction from the composition of the first compound to the composition of the second compound and from the side in contact with the first unit layer to the side in contact with the second unit layer.

For example, in the case where the first compound is TiN, and the second compound is AlN, the intermediate layer interposed therebetween can have the configuration having an atomic ratio of Ti reduced continuously and an atomic ratio of Al increased continuously from the side in contact with the first unit layer to the side in contact with the second unit layer. Moreover, for example, in the case where the first compound is TiAlN and where the second compound is AlN, the intermediate layer can have the configuration having an atomic ratio of at least Ti reduced continuously from the side in contact with the first unit layer to the side in contact with the second unit layer.

The cause of the improvement of the above-described various characteristics by inclusion of the intermediate layer in the multilayer structure including layer is not clear, but the following cause can be considered. In other words, having the intermediate layer between the first unit layer and the second unit layer continuously changes the composition between the first unit layer and the second unit layer, so that a larger distortion is accumulated in the multilayer structure including layer. Moreover, since a thermally stable layer is provided, the modification due to a thermal shock becomes less likely to occur. Additionally, the presence of the intermediate layer raises the adhesion strength between the first unit layer and the second unit layer. Accordingly, the multilayer structure including layer having the intermediate layer can maintain the high hardness of the first compound and the high sliding characteristic of the second compound more effectively, so that the various characteristics such as the wear resistance, welding resistance, thermal shock resistance, and the like can be further improved.

The thickness of the intermediate layer of the present invention is not particularly limited. For example, the thickness of the intermediate layer may be substantially equal to or smaller than the thickness of the first unit layer and/or second unit layer. Moreover, the thickness of the intermediate layer may be exceedingly greater than the respective thickness of the first unit layer or second unit layer. In other words, the thickness of the first unit layer and/or second unit layer may be exceedingly smaller than the intermediate layer.

Moreover, the intermediate layer can be recognized as the first unit layer and/or second unit layer. For example, the case is assumed where the first compound is TiN, and the second compound is AlN, and the composition of the intermediate layer is $Ti_xAl_yN$, and the atomic ratio x of Ti decreases continuously from 1 to 0 and the atomic ratio y of Al continuously increases from 0 to 1 from the side in contact with the first unit layer to the side in contact with the second unit layer. In this case, for example, in the intermediate layer, the region having the atomic ratio x/y of Ti and Al is greater than or equal to 1 can be recognized as the first unit layer, and the region having the atomic ratio x/y of less than 1 can be considered as the second unit layer. In this case, the first unit layer and second unit layer have no clear boundary. It should be noted that, when the thickness of the first unit layer and/or second unit layer is exceedingly smaller than the intermediate layer, the region including the first compound in the first unit layer becomes a maximum point of the Ti concentration in the thickness direction of the layer cycle, and the region including the second compound in the second unit layer becomes a maximum point of the Al concentration in the thickness direction of the layer cycle.

Moreover, in the multilayer structure including layer of the present invention, it is preferable that the first compound has an fcc crystal structure and the second compound has an hop crystal structure. As to the compound such as TiN containing Ti, the compound having the fcc crystal structure can have a higher hardness as compared to the compound having the hcp crystal structure. Moreover, although the compound such as AlN containing Al exhibits a high sliding characteristic in a compound having any of the fcc crystal structure and hcp crystal structure, the compound having the hop crystal structure is easier to form when it is formed by the CVD method Therefore, the multilayer structure including layer with the first compound having the fcc crystal structure and the second compound having the hcp crystal structure can have a high hardness and allows manufacturing with a high yield in a simple manner. Therefore, an inexpensive surface coated member having further improved various characteristics described above can be provided to a market.

Moreover, it has been generally known that, when layers having different compositions are layered by the CVD method, and crystal structures of the layers are different, the adhesion between the layers are lowered. However, as a result of diligent studies, the present inventors found out that the lowering of the adhesion due to different crystal structures of layers is suppressed in the case where the intermediate layer is present between the first unit layer and the second unit layer, or in the case where the first unit layer and the second unit layer do not have a clear boundary, in other words, in the case where the composition is changed from the first compound to the second compound continuously in the thickness direction of one layer cycle. Thus, in the multilayer structure including layer of the present invention, the above-described effect can be exhibited without lowering of the adhesion of the layers in the case where the intermediate layer is present between the first unit layer and the second unit layer, or in the case where the first unit layer and the second unit layer do not have a clear boundary, and where the first compound has the fcc crystal structure and the second compound has the hcp crystal structure.

Moreover, the first compound may further contain Al. In this case, the first compound can be TiAlN, TiAlC, TiAlCN, TiAlCNO, TiAlNO, or the like. This is because the oxidation resistance is improved by further containing Al in the first unit layer.

It should be noted that the compositions of the first unit layer, second unit layer, intermediate layer, and the like, the layer cycle, the crystal structures of the first compound and second compound, and the like in the multilayer structure including layer of the present invention can be confirmed by a scanning electron microscope (SEM), a wavelength dispersion X-ray analysis (EPMA; Electron Probe Micro Analysis), an X ray diffraction method, and the like As described above in detail, according to the surface coated member of the present invention, coating with the hard coating including the above-described multilayer structure including layer improves the various characteristics such as the wear resistance, welding resistance, thermal shock resistance, and the like of the surface coated member. Thus, the present invention can provide a surface coated member having improved stability and a longer service life.

<<Second Embodiment>>
<Method for Manufacturing Surface Coated Member>

A method for manufacturing a surface coated member of the present invention is a method for manufacturing a surface coated member including a base member and a hard coating formed on a surface thereof and constituted of one or more layer. The method includes a CVD step of forming at least one layer among the layers by a CVD method. The CVD step includes a first step of ejecting first gas containing Ti and one or more kind of element selected from the group consisting of B, C, N, and O to the surface of the base member and a second step of ejecting second gas containing Al and one or more kind of element selected from the group consisting of B, C, N, and O to the surface of the base member. The first step and the second step are repeated alternately. It should be noted that, the method for manufacturing a surface coated member of the present invention can include other steps as long as the above-described CVD step is performed. Other steps may include, for example, a step of forming a layer other than the multilayer structure including layer, a cleaning step, and the like. In the following, each step of the second embodiment will be described in detail.

<CVD Step>

The CVD step of the present invention is a step of forming at least one layer among the layers constituting the hard coating of the present invention by the CVD method. In this CVD step, the CVD device shown in FIG. 1 can be used.

Figure 1:
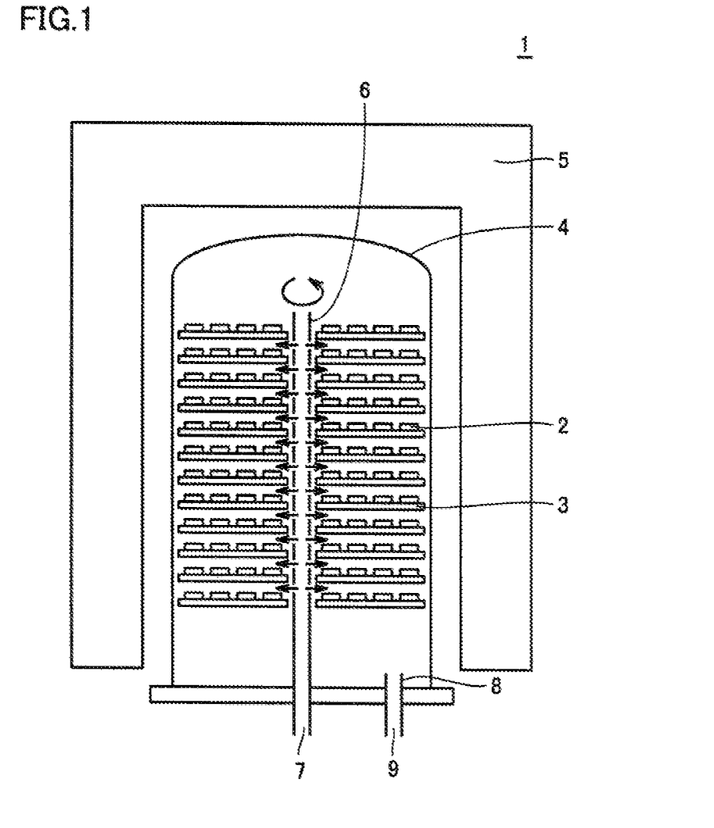
FIG. 1 is a cross-sectional view schematically representing a CVD device used in the CVD step of the present invention.

In FIG. 1, a plurality of base member setting jigs 3 retaining base members 2 can be provided in a CVD device 1, and these are covered in a reactor vessel 4 made of heat-resistant alloy steel. Moreover, a heater 5 is arranged around reactor vessel 4, and the temperature in reactor vessel 4 can be controlled by this heater 5. Moreover, a feed pipe 6 provided with a plurality of through holes is arranged in CVD device 1, and gas introduced into feed pipe 6 through a feed port 7 is ejected to reactor vessel 4 via the through holes. Moreover, this feed pipe 6 can rotate about its axis (refer to the rotating arrow in the drawing). An exhaust pipe 8 is further arranged in reactor vessel 4. The gas ejected to reactor vessel 4 is discharged to outside through an exhaust port 9 of exhaust pipe 8. It should be noted that the jigs and the like in reactor vessel 4 are typically constituted of black lead.

In this step, CVD device 1 shown in FIG. 1 is used to repeat the following first step and second step alternately to form the above-described multilayer structure including layer.

<First Step>

In this step, with use of the above-described CVD device 1, the first gas containing Ti and one or more kind of element selected from the group consisting of B, C, N, and O is ejected to the surface of the base member.

Specifically, in FIG. 1, the first gas containing Ti and one or more kind of element selected from the group consisting of B, C, N, and O is introduced to feed pipe 6 through feed port 7. The first gas introduced through feed port 7 is ejected to reactor vessel 4 through the plurality of through holes of feed pipe 6. At this time, since feed pipe 6 rotates about its axis, the first gas is ejected evenly to the surfaces of base members 2 arranged in the periphery of feed pipe 6.

The first gas containing Ti and one or more kind of element selected from the group consisting of B, C, N, and O can be mixed gas of metal-based gas containing Ti and non-metal-based gas containing one or more kind of element selected from the group consisting of B, C, N, and O. The metal-based gas containing Ti can be titanium chloride gas such as $TiCl_4$. Moreover, the non-metal-based gas containing B may be boron chloride gas such as $BCl_3$. The non-metal-based gas containing C may be hydrocarbon gas such as $CH_2CH_2$. The non-metal-based gas containing N may be nitrogen-containing gas such as $NH_3$, $N_2H_4$, $N_2$, or the like. The non-metal-based gas containing O may be $H_2O$ (vapor). For example, when the first gas containing Ti, B, and C is used, mixed gas containing $TiCl_4$ as the metal-based gas and $BCl_3$ and $CH_2CH_2$ as the non-metal-based gas can be used. It should be noted that the hydrocarbon gas as the non-metal-based gas containing C is preferably hydrocarbon gas made of unsaturated hydrocarbon.

In this step, the temperature in reactor vessel 4 is preferably within the range of 700 to 900° C., and the pressure in reactor vessel 4 is preferably 0.1 to 10 kPa. Moreover, carrier gas such as $N_2$, $H_2$, Ar, or the like can be introduced together with the first gas through feed port 7.

<Second Step>

In this step, with use of the above-described CVD device 1, the second gas containing Al and one or more kind of element selected from the group consisting of B, C, N, and O is ejected to the surface of the base member.

Specifically, in FIG. 1, the second gas containing Al and one or more kind of element selected from the group consisting of B, C, N, and O is introduced to feed pipe 6 through feed port 7. The second gas introduced through feed port 7 is ejected to reactor vessel 4 through a plurality of through holes of feed pipe 6. At this time, since feed pipe 6 rotates about its axis, the second gas is evenly ejected to the surfaces of base members 2 arranged in the periphery of feed pipe 6 as a center.

As the second gas containing Al and one or more kind of element selected from the group consisting of B, C, N, and O, mixed gas including metal-based gas containing Al and non-metal-based gas containing one or more kind of element selected from the group consisting of B, C, N, and O can be used. The metal-based gas containing Al may be aluminum chloride gas such as $AlCl_3$. It should be noted that, since the non-metal-based gas containing any one of B, C, N, and O is the same as the gas in the above-described first step, description thereof will not be repeated. Thus, for example, in the case of using the second gas containing Al, B, and C, mixed gas including $AlCl_3$ as the metal-based gas and $BCl_3$ and $CH_2CH_2$ as the non-metal-based gas can be used.

In this step, the temperature in reactor vessel 4 is preferably within the range of 700 to 900° C., and the pressure in reactor vessel 4 is preferably within the range of 0.1 to 10 kPa. Moreover, carrier gas such as $N_2$, $H_2$, Ar, or the like together with the second gas can be introduced through feed port 7.

<Repetition of the First Step and Second Step>

In the manufacturing method of the present invention, the above-described first step and the above-described second step are repeated alternately. In other words, the first gas and the second gas are introduced alternately into feed pipe 6 Accordingly, the first gas and the second gas are ejected alternately to the surfaces of base members 2.

By performing the steps described above in detail, a multilayer structure including layer having the first unit layer resulting from the first gas and the second unit layer resulting from the second gas being layered alternately can be formed on the surfaces of base members 2. Specifically, a multilayer structure including layer can be formed in which the first unit layer including the first compound containing Ti and one or more kind of element selected from the group consisting of B, C, N, and O and the second unit layer including the second compound containing Al and one or more kind of element selected from the group consisting of B, C, N, and O are layered alternately. Thus, by using this manufacturing method, the surface coated member having various improved characteristics such as wear resistance, welding resistance, thermal shock resistance, and the like can be manufactured by forming a hard coating including at least one layer of multilayer structure including layer. Accordingly, the surface coated member having improved stability and a longer service life can be manufactured.

It should be noted that the compositions of the first unit layer and second unit layer can be controlled by mixing ratios of the metal-based gas and non-metal-based gas. The thicknesses of the first unit layer and the second unit layer can be controlled by a film-forming time. The layer cycle and the number of layers can be controlled by a rotating speed of feed pipe 6. Moreover, by controlling the film-forming temperature, the respective crystal structures (fcc-type crystal structure or hcp-type crystal structure) of the first compound and second compound can be controlled. Moreover, the composition and thickness of the intermediate layer can be controlled by controlling a speed of introducing the metal-based gas and non-metal-based gas. Specifically, in the above-described CVD step, the intermediate layer having a large thickness can be formed by introducing the metal-based gas and non-metal-based gas at a relatively lower speed, and the intermediate layer having a small thickness can be formed by introducing the metal-based gas and non-metal-based gas at a relatively higher speed.

<Modified Example>

In the first step of the present invention, the first gas may further contain Al. In other words, while the above-described first step and second step are repeated alternately, the metal-based gas containing Al may be constant or varied in its amount of introduction (mol/min), the metal-based gas is at least introduced into reactor vessel 4 all the time. In other words, in the CVD step, the metal-based gas containing Al and the non-metal-based gas containing one or more kind of element selected from the group consisting of B, C, N, and O are introduced into reactor vessel 4 all the time, and the metal-based gas containing Ti is introduced into reactor vessel 4 intermittently.

In this case, in the formed multilayer structure including layer, the first unit layer includes the first compound containing Ti, Al, and one or more kind of element selected from the group consisting of B, C, N, and O, and the second unit layer includes the second compound containing Al and one or more kind of element selected from the group consisting of B, C, N, and O.

<<Third Embodiment>>
<Method for Manufacturing Surface Coated Member>

The method for manufacturing a surface coated member according to the present invention is a method for manufacturing a surface coated member including a base member and a hard coating formed on a surface thereof and constituted of one or more layers. The method includes a CVD step of forming at least one layer among the layers by a CVD method. The CVD step includes a first step of ejecting first gas containing Ti and one or more kind of element selected from the group consisting of B, C, N, and O to a surface of the base member and a second step of ejecting second gas containing Al and one or more kind of element selected from the group consisting of B, C, N, and O to the surface of the base member. The first step and second step are repeated alternately. Hereinafter, in the present embodiment, the portion which is different from the above-described second embodiment will be mainly described.

<CVD Step>

The CVD step of the present invention is a step of forming at least one layer among the layers constituting the hard coating of the present invention by the CVD method. In this CVD step, the CVD device shown in FIG. 2 can be used.

Figure 2:
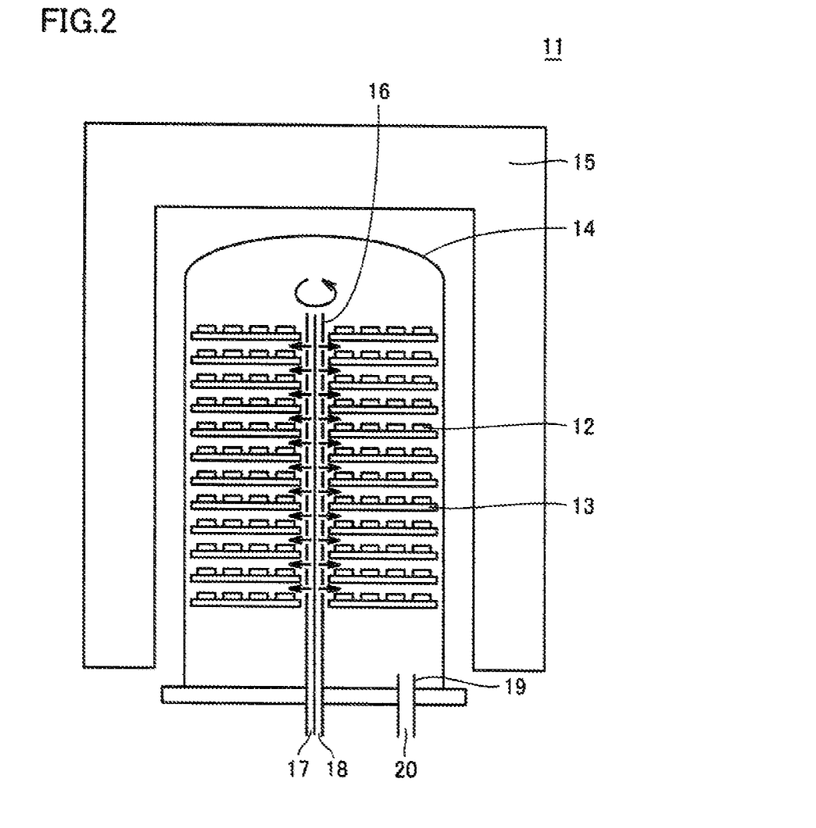
FIG. 2 is a cross-sectional view schematically representing another CVD device used in the CVD step of the present invention.

In FIG. 2, a plurality of base member setting jigs 13 retaining base members 12 can be arranged in a CVD device 11, and these are covered in a reactor vessel 14 made of heat-resistant alloy steel. Moreover, a heater 15 is arranged in the periphery of reactor vessel 14, and the temperature in reactor vessel 14 can be controlled by this heater 15. Moreover, a feed pipe 16 provided with a plurality of through holes is arranged in CVD device 11, and this feed pipe 16 has two feed ports 17, 18. Gases introduced into feed pipe 16 through respective feed ports 17, 18 are not mixed in feed pipe 16, and are ejected to reactor vessel 14 through different through holes respectively. Moreover, this feed pipe 16 can rotate about its axis (refer to the rotating arrow in the drawing). An exhaust pipe 19 is further arranged in reactor vessel 14, and the gas ejected in reactor vessel 14 is discharged to outside through exhaust port 20 of exhaust pipe 19. It should be noted that the jigs and the like provided in reactor vessel 14 are typically constituted of black lead.

In this step. CVD device 11 shown in FIG. 2 is used to repeat the following first step and second step alternately, so that a multilayer structure including layer can be formed as one layer constituting the hard coating which coats the surfaces of the surface coated member of the present invention.

<First Step>

In this step, with use of the above-described CVD device 11, the first gas containing Ti and one or more kind of element selected from the group consisting of B, C, N, and O is ejected to the surfaces of the base members.

Specifically, in FIG. 2, the metal-based gas containing Ti is introduced in feed pipe 16 through feed port 17. At the same time, the non-metal-based gas containing one or more kind of element selected from the group consisting of B, C, N, and O is introduced in feed pipe 16 through feed port 18. The metal-based gas introduced through feed port 17 and the non-metal-based gas introduced through feed port 18 are ejected in reactor vessel 14 through a plurality of different through holes 18 respectively. At this time, since feed pipe 16 rotates about its axis, the metal-based gas and the non-metal-based gas are mixed immediately after being ejected into reactor vessel 14. Then, the mixed gas is evenly ejected as the first gas to the surfaces of base members 12 arranged in a periphery of feed pipe 16.

As the metal-based gas containing Ti and the non-metal-based gas containing one or more kind of element selected from the group consisting of B, C, N, and O, the same gas as the gas mentioned in the second embodiment can be used. Moreover, in this step, the temperature in reactor vessel 14 is preferably within the range of 600 to 900° C., and the pressure in reactor vessel 14 is preferably within the range of 0.1 to 10 kPa. Moreover, carrier gas such as $N_2$, $H_2$, Ar, or the like together with the first gas can be introduced respectively through feed ports 17, 18.

<Second Step>

In this step, with use of the above-described CVD device 11, the second gas containing Al and one or more kind of element selected from the group consisting of B, C, N, and O is ejected toward the surfaces of the base members.

Specifically, in FIG. 2, the second gas containing Al is introduced to feed pipe 16 through feed port 18. At the same time, the non-metal-based gas containing one or more kind of element selected from the group consisting of B, C, N, and O is introduced in feed pipe 16 through feed port 18. The metal-based gas introduced through feed port 17 and the non-metal-based gas introduced through feed port 18 are ejected in reactor vessel 14 through a plurality of different through holes. At this time, since feed pipe 16 rotates about its axis, the metal-based gas and the non-metal-based gas are mixed immediately after being ejected to reactor vessel 14. Then, the mixed gas as the second is evenly ejected to the surfaces of base members 12 arranged in the periphery of feed pipe 16.

As the metal-based gas containing Al and the non-metal-based gas containing one or more kind of element selected from the group consisting of B, C, N, and O, the gas which is the same as the gas mentioned in the second embodiment can be used. Moreover, in this step, the temperature in reactor vessel 14 is preferably within the range of 600 to 900° C., and the pressure in reactor vessel 14 is preferably within the range of 0.1 to 10 kPa. Moreover, carrier gas such as $N_2$, $H_2$, Ar, or the like together with the second gas can be introduced through feed ports 17, 18 respectively.

<Repetition of First Step and Second Step>

In the manufacturing method according to the present invention, the above-described first step and the above-described second step are repeated alternately. In other words, the metal-based gas containing Ti and the metal-based gas containing Al are alternately introduced through feed port 17, and the non-metal-based gas containing one or more kind of element selected from the group consisting of B, C, N, and O is introduced continuously through feed port 18. At this time, the rotation of feed pipe 16 disperses the first gas in reactor vessel 14 in the case where the metal-based gas containing Ti is introduced through feed port 17, and the rotation of feed pipe 16 disperses the second gas in reactor vessel 14 in the case where the metal-based gas containing Al is introduced through feed port 17.

By performing the steps described above in detail, the multilayer structure including layer having the first unit layer resulting from the first gas and the second unit layer resulting from the second gas being layered alternately can be formed on the surface of base member 2. Specifically, the multilayer structure including layer can be formed in which the first unit layer including the first compound containing Ti and one or more kind of element selected from the group consisting of B, C, N, and O and the second unit layer including the second compound containing Al and one or more kind of element selected from the group consisting of B, C, N, and O are layered alternately. Thus, the hard coating including at least one layer of the multilayer structure including layer is formed with use of this manufacturing layer, so that the surface coated member having improved various characteristics such as wear resistance, welding resistance, thermal shock resistance, and the like can be manufactured. Accordingly, a surface coated member having improved stability and a longer service life can be manufactured.

It should be noted that the compositions of the first unit layer and second unit layer can be controlled by the mixing ratio of the metal-based gas and non-metal-based gas. The thicknesses of the first unit layer and second unit layer can be controlled by a film-forming time. The layer cycle and the number of layers can be controlled by a rotating speed of feed pipe 6. Moreover, by controlling the film-forming temperature, the respective crystal structures (fcc-type crystal structure or hcp-type crystal structure) of the first compound and second compound can be controlled. Moreover, the composition and the thickness of the intermediate layer can be controlled by controlling the speed of introducing the metal-based gas and non-metal-based gas. Specifically, in the above-described CVD step, an intermediate layer having a large thickness can be formed by introducing the metal-based gas and non-metal-based gas at a relatively lower speed, and an intermediate layer having a small thickness can be formed by introducing the metal-based gas and non-metal-based gas at a higher speed.

Moreover, the manufacturing method according to the present embodiment can be used suitably for the case where the multilayer structure including layer is formed with use of first gas and/or second gas as non-metal-based gas containing at least one kind selected from the group consisting of $N_2$, $NH_3$, and $N_2H_3$. Among those, it is preferable to use at least any one of $NH_3$ and $N_2H_2$ as the non-metal-based gas. The reason is as follows.

In other words, since the $NH_3$ and $N_2H_4$ have a high reactivity with halogenated compounds such as $TiCl_4$ and $AlCl_3$, there is an advantage that more homogenous titanium nitride layer and aluminum nitride layer can be formed in a short time by using those as the non-metal-based gas. However, on the other hand, there is a disadvantage that such a high reactivity causes an unnecessary reaction with the above-described halogenated compounds. Since a reactant resulting from this unnecessary reaction causes clogging of the feed pipe and through holes of the CVD device, these gases were difficult to handle in the CVD method in the actual situation. On the other hand, according to the manufacturing method of the present invention, since the metal-based gas and non-metal-based gas are mixed immediately after being ejected to the reactor vessel, the unnecessary reaction does not occur when passing through the feed pipe and through holes. Thus, according to the manufacturing method of the present invention, more homogenous multilayer structure including layer can be formed in a short time with use of at least any one of $NH_3$ and $N_2H_4$.

Moreover, according to the manufacturing method of the present embodiment, it is preferable to use gas having at least one of $NH_3$ and $N_2H_4$ mixed with $N_2$ as the non-metal-based gas. By mixing at least one of $NH_3$ and $N_2H_4$ with $N_2$, formation of the multi layer structure including layer under the temperature environment with a temperature 200 to 300° C. lower than the case of not being mixed can be made.

<Modified Example>

In the first step of the present invention, the first gas may further contain Al.

In other words, while the above-described first step and second step are repeated alternately, the metal-based gas containing Al is introduced into reactor vessel 4 at least all the time even though the amount to be introduced (mol/min) is constant or varied. In other words, in the CVD step, the metal-based gas containing Al and the non-metal-based gas containing one or more kind of element selected from the group consisting of B, C, N, and O are introduced to reactor vessel 4 all the time, and the metal-based gas containing Ti is introduced to reactor vessel 4 intermittently.

EXAMPLES

In the following, examples of the present invention will be described more in detail. However, the present invention is not limited to the examples.

<Preparation of Base Member>

A base member A and a base member B described in the Table 1 below were prepared. Specifically, the material powders of the blend compositions described in Table 1 were evenly mixed and press-formed into a predetermined shape, and thereafter sintered at 1300 to 1500° C. for one to two hours, so that base members made of cemented carbide having two kinds of shapes including CNMG120408NUX and SEET13T3 AGSN-G were obtained. In other words, two different kinds of shapes were provided for each base member. It should be noted that the "Remainder" in Table 1 indicates that WC takes up the remainder of the blend composition (mass %).

Both of the two kinds of shapes described above are manufactured by Sumitomo Electric Hardmetal Division. CNMG120408NUX is a shape of a cutting edge replaceable-type cutting tip for turning, and SEET13T3AGSN-G is a shape of a cutting edge replaceable-type cutting tip for rotary cutting (milling).

TABLE 1

| | | Blend Composition (Mass %) | | | |
|---|---|---|---|---|---|
| | | Co | $Cr_3C_2$ | TaC | WC |
| Super Hard | A | 5.2 | 0.5 | — | Remainder |
| Base Members | B | 10.0 | — | 2.0 | Remainder |

<Formation of Multilayer Structure Including Layer>

A multilayer structure including layer was formed on the surface of each member obtained as described above. Specifically, CVD device 11 shown in FIG. 2 was used, and the base members were set in reactor vessel 14, and a CVD method was conducted to form the multilayer structure including layer on the base members. The conditions for forming each multilayer structure including layer were as described in the following Table 2.

Referring to Table 2, there were seven conditions a to g for the forming conditions of the multilayer structure including layer. In the forming conditions a to g. TiCl$_4$ was used as the metal-based gas containing Ti, and AlCl$_3$ was used as the metal-based gas containing Al. These metal-based gases together with carrier gases of H$_2$ and N$_2$ were introduced into feed pipe 16 through feed port 17. Moreover, with use of NH$_3$ and N$_2$ as the non-metal-based gas containing N, the non-metal-based gas was introduced to feed pipe 16 through feed port 18. Then, it was so configured that the metal-based gas and non-metal-based gas were ejected from different through holes respectively by rotation of feed pipe 16, so that the first gas having mixed TiCl$_4$, NH$_3$, and N$_2$ were ejected to the surfaces of the base members when TiCl$_4$ was introduced through feed port 17, and the second gas having mixed AlCl$_3$, NH$_3$, and N$_2$ was ejected to the surfaces of the base members when AlCl$_3$ was introduced through feed port 17.

Specifically, for example, in forming condition a, AlCl$_3$ of 0.1 mol/min, H$_2$ of 2.9 mol/min, and N$_2$ of 1.0 mol/min were introduced into reactor vessel 14 through feed port 17, and TiCl$_4$ of 0.025 mol/min was introduced through feed port 17 with intervals of 10 seconds. Moreover, the non-metal-based gas having NH$_3$ and N$_2$ mixed so as be 0.09 mol/min and 0.9 mol/min was introduced to reactor vessel 14 through feed port 18. It should be noted that "0→0.025" in the column "TiCl$_4$ flow rate (mol/min)" of Table 2 indicates that the repetition of introducing TiCl$_4$ for 10 seconds at a flow rate of 0.025 mol/min, stopping the introduction for 10 seconds, and again introducing for 10 seconds at a flow rate of 0.025 mol/min was conducted. Then, by introducing each gas through feed port 17 and feed port 18, and rotating feed pipe 16 at 5 rpm, the first gas having mixed TiCl$_4$, NH$_3$, and N$_2$ and the second gas having mixed AlCl$_3$, NH$_3$, and N$_2$ were ejected alternately to the surfaces of the base members. Inside of reactor vessel 14 at this time was retained in the condition with the pressure of 1.3 kPa and the temperature of 800° C. By performing this for 30 minutes, a multilayer including layer having a thickness of 5.0 μm was formed.

In each of the forming conditions, the thickness of the multilayer structure including layer was controlled by the film-forming time, and the layer cycle of TiN and AlN in the multilayer structure including layer was controlled with the rotating speed (rpm) of feed pipe 16 and the amount of non-metal-based gas introduced (mol/min).

<Confirmation of Multilayer Structure Including Layer>

The configuration of each formed multilayer structure including layer was confirmed with an SEM, an EPMA, and an X ray diffraction method. The result is shown in Table 3. In Table 3, the forming condition a has "fcc-TiN (50 nm)/hcp-AlN (100 nm)." It indicates that the first compound constituting the first unit layer is TiN having the fcc crystal structure and has a thickness of 50 nm, and that the second compound constituting the second unit layer is AlN having the hcp crystal structure and has a thickness of 100 nm, and that the layers are layered alternately. Moreover, the "Layer Cycle" indicates a distance between a midpoint of the TiN layer in the thickness direction and a midpoint of the adjacent TiN layer in the thickness direction through one AlN layer, in other words, a sum of the thickness of one TiN layer and the thickness of one AlN layer. The "thickness (μm)" indicates a thickness of the multilayer structure including layer.

Moreover, Table 3 shows layers formed by the forming conditions x, y as Comparative Examples. In the forming condition x, the hard coating was formed with use of the PVD method disclosed in PTD 1. In the forming condition y, the hard coating was formed with use of the CVD method disclosed in PTD 2. In the forming condition x, a layer of a layered structure, in which the TiN layer of the fcc crystal structure having a thickness of 4 nm and the AlN layer of the fcc crystal structure having a thickness of 4 nm are formed (AlN/TiN layer), was formed. In the forming condition y, a layer of a single layer having the fcc crystal structure and including the main composition of Ti$_{0.1}$Al$_{0.9}$N (Ti$_{0.1}$Al$_{0.9}$ layer) was formed.

TABLE 3

| | | Characteristics of Layers | | | |
|---|---|---|---|---|---|
| | | Thickness of Unit Layer and Thickness of Layer Cycle (nm) | Thickness (μm) | Friction Coefficient | Welding Amount (μm$^2$) |
| Examples | a | fcc-TiN (50)/ hcp-AlN (100) Layer Cycle (150) | 5.0 | 0.35 | 0.20 × 10$^{-3}$ |
| | b | fcc-TiN (100)/ hcp-AlN (200) Layer Cycle(300) | 10.0 | 0.30 | 0.16 × 10$^{-3}$ |

TABLE 2

| | | Film-Forming Conditions | | | | | | |
|---|---|---|---|---|---|---|---|---|
| | | Forming Method | Rotating Speed (rpm) | AlCl$_3$ Flow Rate (mol/min) | TiCl$_4$ Flow Rate (mol/min) | TiCl$_4$ Interval (second) | Non-Metal-Based Gas Flow Rate (mol/min) | Pressure in Furnace (kPa) | Temperature in Furnace (° C.) |
| Examples | a | CVD | 5 | 0.1 | 0→0.025 | 10 | NH$_3$ (0.09) N$_2$ (0.9) | 1.3 | 800 |
| | b | CVD | 2 | 0.1 | 0→0.025 | 10 | NH$_3$ (0.09) N$_2$ (0.9) | 1.3 | 800 |
| | c | CVD | 2 | 0.05 | 0→0.025 | 10 | NH$_3$ (0.09) N$_2$ (0.9) | 1.0 | 750 |
| | d | CVD | 7 | 0.05 | 0.025→0.05 | 5 | NH$_3$ (0.09) N$_2$ (0.9) | 1.0 | 780 |
| | e | CVD | 10 | 0.1 | 0→0.05 | 5 | NH$_3$ (0.09) N$_2$ (0.9) | 1.3 | 750 |
| | f | CVD | 7 | 0.1 | 0.025→0.05 | 5 | CH$_3$CN (0.005) | 1.0 | 780 |
| | g | CVD | 2 | 0.1 | 0→0.025 | 10 | CH$_3$CN (0.005) | 1.3 | 800 |

TABLE 3-continued

| | | Characteristics of Layers | | | |
|---|---|---|---|---|---|
| | | Thickness of Unit Layer and Thickness of Layer Cycle (nm) | Thickness (μm) | Friction Coefficient | Welding Amount (μm$^2$) |
| | c | fcc-TiN (200)/ hcp-AlN (100) Layer Cycle (300) | 2.0 | 0.40 | $0.22 \times 10^{-3}$ |
| | d | fcc-TiN (100)/ hcp-AlN (100) Layer Cycle (200) | 18.0 | 0.30 | $0.15 \times 10^{-3}$ |
| | e | fcc-TiN (50)/ hcp-AlN (50) Layer Cycle (100) | 7.0 | 0.30 | $0.16 \times 10^{-3}$ |
| | f | fcc-TiCN (100)/ hcp-AlN (100) Layer Cycle (200) | 18.0 | 0.40 | $0.45 \times 10^{-3}$ |
| | g | fcc-TiCN (100)/ hcp-AlN (200) Layer Cycle (300) | 5.0 | 0.35 | $0.22 \times 10^{-3}$ |
| Comparative Examples | x | fcc-TiN (4)/ fcc-AlN (4) Layer Cycle (8) | 5.0 | 0.60 | $1.40 \times 10^{-3}$ |
| | y | fcc-Ti$_{0.1}$Al$_{0.9}$N | 5.0 | 0.70 | $1.60 \times 10^{-3}$ |

<Sliding Characteristic of Multilayer Structure Including Layer>

As to the multilayer structure including layers formed by respective forming conditions of a to g and the layers formed in the forming conditions x, y, a frictional force was found by conducting a pin-on-disk experiment under the following conditions to thereby calculate a friction coefficient (frictional force/load). Moreover, as to each surface of each layer after the pin-on-disk experiment, measurement was contact for four times for each with use of a stylus type surface roughness meter crossing a sliding groove after the experiment to thereby calculate a welding quantity (μm$^2$) with respect to a sliding part. It should be noted that the welding quantity (μm$^2$) was an area of the part protruding above the coated uppermost surface, in other words, the welding quantity was the upper protruding part area in the sliding groove cross section.

<Pin-on-Disk Experiment Conditions>
Ball Material: SUS304
Ball Radius: 2 mm
Load: 1N
Rotating Speed: 3 m/min
Sliding Distance: 3 m
Environment: under atmospheric pressure environment The results of friction coefficients and welding quantities are shown in Table 3. As is clear from Table 3, the multilayer structure including layers of the present invention formed by the forming conditions a to g were, as compared to each of the conventional layers formed by the forming conditions x and y, smaller in the friction coefficient and less in the welding quantities, in other words, had a higher welding resistance and a higher sliding characteristic.

<Production of Surface Coated Member>

By forming the hard coatings on the base members by the conditions of Table 2 described above and Table 4 described below, cutting tools having the surface coated members of Examples 1 to 15 and Comparative Examples 1 to 6 shown in the following Table 5 were produced. Each layer described in Table 4 was formed by introducing mixed gas, which is formed by mixing each gas shown in Table 4 so as to have the ratios of volume % shown in Table 4, through feed port 17 so as to have the total gas volume (L/min) shown in Table 4 and performing the CVD step under the environment shown in Table 4 It should be noted that the "Remainder" in Table 4 indicates that H$_2$ takes up the remainder of the source gas (reactive gas). Moreover, "Total Gas Volume" indicates the total volume flow rate introduced into reactor vessel 14 per unit time, assuming that the gas under the condition (0° C., 1 atmospheric pressure) as the ideal gas.

For example, the cutting tool of Example 13 employs base member B described in Table 1 as the base member. A TiN layer (base layer) having a thickness of 1.0 μm as a base layer was formed on the surface of base member B in the condition of Table 4. A TiCN layer having a thickness of 3.0 μm was formed on the TiN layer (base layer) in the condition of Table 4. A multilayer structure including layer having a thickness of 3.0 μm was formed on the TiCN layer in the forming condition f of Table 2. A TiN layer (outermost layer) having a thickness of 0.5 μm was formed on the multilayer structure including layer in the condition of Table 4. It indicates the configuration in which the hard coating having a total thickness of 7.5 μm was formed on the base member. The blank (hyphen) in Table 5 indicates that the corresponding layer was not formed.

It should be noted that the base layer and the multilayer structure including layer may have the same composition but different thickness. For example, while the multilayer structure including layer of Example 1 is a layer having a thickness of 10 μm formed in the forming condition e, the multilayer structure including layer of Example 8 is a layer having a thickness of 15 μm formed in the forming condition e. The difference in thicknesses of these layers was controlled by adjusting the forming time of the layer, in other words, by adjusting the total time of ejecting the first gas and second gas to the surface of base member alternately.

TABLE 4

| Configuration of Layer Kind | Film-Forming Conditions Reaction Gas Composition (Volume %) | Reaction Atmosphere | | |
|---|---|---|---|---|
| | | Pressure (kPa) | Temperature (° C.) | Total Gas Amount (L/min) |
| TiN(Base Layer) | TiCl$_4$ = 2.0%, N$_2$ = 39.7%, H$_2$ = Remainder | 6.7 | 915 | 63.8 |
| TiN(Outermost layer) | TiCl$_4$ = 0.5%, N$_2$ = 41.2%, H$_2$ = Remaider | 79.8 | 980 | 45.9 |
| TiCN | TiCl$_4$ = 2.0%, CH$_3$CN = 0.7%, H$_2$ = Remainder | 9 | 860 | 50.5 |
| TiBNO | TiCl$_4$ = 36.7%, BCl$_3$ = 0.1%, CO = 1.6%, CO$_2$ = 1.7%, N$_2$ = 61.7%, H$_2$ = Remainder | 6.7 | 980 | 80.3 |
| TiCNO | TiCl$_4$ = 2.1%, CO = 3.2%, CH$_4$ = 2.8%, N$_2$ = 23.7%, H$_2$ = Remainder | 16.0 | 1030 | 70.5 |
| Al$_2$O$_3$ | AlCl$_3$ = 1.6%, CO$_2$ = 4.5%, H$_2$S = 0.2%, HCl = 3.5%, H$_2$ = Remainder | 6.7 | 1000 | 46.2 |

TABLE 5

| | Base Member | Base Layer (μm) | Multilayer Structure Including Layer (μm) | Outermost Layer (μm) | Total Layer Thickness (μm) |
|---|---|---|---|---|---|
| Example 1 | A | TiN (0.5)—TiCN (2.5) | e (10.0) | — | 13.0 |
| Example 2 | A | TiN (0.5)—TiCN (2.5) | d (10.0) | — | 13.0 |
| Example 3 | A | TiN (0.5)—TiCN (2.5) | a (10.0) | — | 13.0 |
| Example 4 | A | TiN (0.5)—TiCN (2.5) | f (10.0) | — | 13.0 |
| Example 5 | A | TiN (1.5) | c (15.0) | — | 16.5 |
| Example 6 | A | TiN (1.5) | f (15.0) | — | 16.5 |
| Example 7 | A | TiN (1.5) | g (15.0) | — | 16.5 |
| Example 8 | A | TiN (1.5) | e (15.0) | — | 16.5 |
| Example 9 | A | TiN (0.5)—TiCN (5.0) | d (6.0) | — | 11.5 |
| Example 10 | B | TiN (1.0) | a (5.0) | TiN (1.0) | 7.0 |
| Example 11 | B | TiN (1.0) | d (5.5) | — | 6.5 |
| Example 12 | B | TiN (1.0) | g (5.5) | — | 6.5 |
| Example 13 | B | TiN (1.0)—TiCN (3.0) | f (3.0) | TiN (0.5) | 7.5 |
| Example 14 | B | TiN (1.0)—TiCN (3.0) | a (3.5) | — | 7.5 |
| Example 15 | B | TiN (1.0)—TiCN (3.0) | b (2.5) | TiBN (0.3)—$Al_2O_3$(1.0) | 7.8 |
| Comparative Example 1 | A | — | x (10.0) | — | 10.0 |
| Comparative Example 2 | A | TiN (0.5)—TiCN (2.5) | x (10.0) | — | 13.0 |
| Comparative Example 3 | B | TiN (1.0) | x (5.0) | TiN (1.0) | 7.0 |
| Comparative Example 4 | A | TiN (0.5)—TiCN (2.5) | y (10.0) | — | 13.0 |
| Comparative Example 5 | A | TiN (1.5) | y (15.0) | TiN (0.5) | 16.5 |
| Comparative Example 6 | B | TiN (1.0)—TiCN (3.0) | y (2.5) | — | 6.5 |

<Cutting Experiments>

The following four cutting experiments were conducted with use of the cutting tools obtained as described above.

<Cutting Experiment 1>

As to the cutting tools of Examples and Comparative Examples described in the following Table 6 (the one having the shape of the base member of CNMG120408NUX was used), the machining time was measured until the flank wear amount (Vb) becomes 0.20 mm by the following cutting conditions, and the final damage form of the cutting edge was observed. The result is shown in Table 6. It indicates that, as the machining time is longer, the wear resistance is superior. Moreover, it indicates that, as the final damage form is closer to the normal wear, the welding resistance is superior.

<Cutting Conditions>

Work Material: SUS316 round bar outer periphery cutting
Peripheral Speed 180 m/min
Feed Rate: 0.15 mm/rev
Cutting Amount: 1.0 mm
Cutting Liquid: Present

TABLE 6

| | Cutting Time (min) | Final Damage Form |
|---|---|---|
| Example 1 | 25.0 | Normal Wear |
| Example 4 | 30.0 | Normal Wear |
| Example 6 | 45.0 | Normal Wear |
| Example 8 | 40.0 | Normal Wear |
| Comparative Example 1 | 10.0 | Chipping |
| Comparative Example 2 | 10.0 | Chipping |
| Comparative Example 4 | 15.0 | Normal Wear |

As is clear from Table 6, the cutting tools of the Examples according to the present invention were, as compared to the cutting tools of the Comparative Examples, superior in both the wear resistance and welding resistance, and had improved stability and a longer service life. It should be noted that, in the final damage form of Table 6, the "Normal Wear" indicates a damage form constituted of only wear without occurrence of chipping or loss (having a smooth worn surface), and the "Chipping" indicates a fine loss occurred in the cutting edge.

<Cutting Experiment 2>

As to the cutting tools of the Examples and Comparative Examples described in the following Table 7 (the base member having a shape of CNMG120408NUX was used), the machining time to obtain the flank wear amount (Vb) of 0.20 mm under the following cutting condition was measured, and the final damage form of the cutting edge was observed. The result is shown in Table 7. It indicates that, as the machining time is longer, the wear resistance is superior. Moreover, it indicates that, as the final damage form is closer to the normal wear, the welding resistance is superior.

<Cutting Conditions>

Work Material: FCD700 round bar outer periphery cutting
Peripheral Speed. 200 m/min
Feed Rate: 0.15 mm/rev
Cutting Amount: 1.0 mm
Cutting Liquid: Present

TABLE 7

| | Cutting Time (min) | Final Damage Form |
|---|---|---|
| Example 2 | 18.0 | Normal Wear |
| Example 3 | 20.0 | Normal Wear |
| Example 6 | 30.0 | Normal Wear |
| Example 7 | 25.0 | Normal Wear |
| Comparative Example 2 | 9.0 | Fracture |
| Comparative Example 5 | 13.0 | Fracture |

As is clear from Table 7, the cutting tools of the Examples according to the present invention were, as compared to the cutting tools of Comparative Examples, superior in both the wear resistance and welding resistance, and had improved stability and a longer service life. It should be noted that, in the final damage form of Table 7, the "Normal Wear" indicates a damage form constituted of only wear without occurrence of chipping or loss (having a smooth worn surface), and the "Fracture" indicates a large loss occurred in the cutting edge.

<Cutting Experiment 3>

As to the cutting tools of Examples and Comparative Examples described in the following Table 8 (the base member having a shape of SEET13T3AGSN-G was used), the cutting distance to obtain the fracture or flank wear amount (Vb) of 0.20 mm under the following cutting conditions was measured, and the final damage form of the cutting edge was observed. The result is shown in Table 8. It indicates that, as the machining time is longer, the welding resistance is superior. Moreover, it indicates that, as the final damage form is closer to the normal wear, the thermal shock resistance is superior.

<Cutting Conditions>
Work Material: SUS304 block material
Peripheral Speed: 200 m/min
Feed Rate: 0.3 mm/s
Cutting Amount: 2.0 mm
Cutting Liquid: Absent
Cutter: WGC4160R (manufactured by Sumitomo Electric Hardmetal Division)

TABLE 8

| | Cutting Distance(m) | Final Damage Form |
|---|---|---|
| Example 10 | 9.0 | Normal Wear |
| Example 12 | 9.9 | Normal Wear |
| Example 13 | 10.5 | Normal Wear |
| Example 14 | 10.2 | Normal Wear |
| Comparative Example 3 | 3.9 | Fracture |
| Comparative Example 6 | 4.5 | Chipping |

As is clear from Table 8, the cutting tools of the Examples according to the present invention were, as compared to the cutting tools of the Comparative Examples, superior in both the welding resistance and thermal shock resistance, and had improved stability and a longer service life. It should be noted that, in the final damage form of Table 8, the "Normal Wear" indicates a damage form constituted only of wear without chipping or loss (having a smooth worn surface), and the "Fracture" indicates a large loss occurred in the cutting edge, and the "Chipping" indicates fine loss occurred in the cutting edge.

<Cutting Experiment 4>

As to the cutting tools of the Examples and Comparative Examples described in the following Table 9 (the cutting tool having the shape of SEET13T3AGSN-G was used), the cutting distance to obtain the fracture of flank wear amount (Vb) of 020 mm under the following cutting condition was measured, and the final damage form of the cutting edge was measured. The result is shown in Table 9. It indicates that, as the cutting distance is longer, the welding resistance is superior. Moreover, it indicates that, as the final damage form is closer to the normal wear, the thermal shock resistance is superior.

<Cutting Conditions>
Work Material: SCM435 block material
Peripheral Speed: 300 m/min
Feed Rate: 0.3 mm/s
Cutting Amount: 2.0 mm
Cutting Liquid: Present
Cutter: WGC4160R (manufactured by Sumitomo Electric Hardmetal Division)

TABLE 9

| | Cutting Distance(m) | Final Damage Form |
|---|---|---|
| Example 11 | 17.4 | Normal Wear |
| Example 12 | 16.5 | Normal Wear |
| Example 13 | 18.0 | Normal Wear |
| Example 15 | 19.5 | Normal Wear |
| Comparative Example 3 | 9.0 | Normal Wear |
| Comparative Example 6 | 12.0 | Normal Wear |

As is clear from Table 9, the cutting tools of the Examples according to the present invention were, as compared to the cutting tools of the Comparative Examples, superior at least in the welding resistance, and had improved stability and a longer service life. It should be noted that, in the final damage form of Table 9, the "Normal Wear" indicates a damage form constituted of only wear without occurrence of chipping or loss (having a smooth worn surface).

As described above, the embodiments and examples of the present invention were described. However, the appropriate combinations of each embodiment and example described above was expected from the original.

It is to be understood that the embodiments and examples disclosed herein are only by way of example in all aspects, and not to be taken by way of limitation. The scope of the present invention is not limited by the description above, but rather by the terms of the appended claims, and is intended to include any modifications within the scope and meaning equivalent to the terms of the claims.

REFERENCE SIGNS LIST

1, 11 CVD device; 2, 12 base member; 3, 13 base member setting jig; 4, 14 reactor vessel; 5, 15 heater 6, 16 feed pipe; 7, 17, 18 feed port; 8, 19 exhaust pipe; 9, 20 exhaust port.

The invention claimed is:

1. A method for manufacturing a surface coated member, said surface coated member including a base member and a hard coating formed on a surface thereof and constituted of one or more layers, comprising:

a CVD step of forming at least one layer among said layers by a CVD method, said CVD step including:

a first step of ejecting a first gas containing Ti and one or more kind of element selected from the group consisting of B, C, N, and O to a surface of said base member, and a second step of ejecting a second gas containing Al and one or more kind of element selected from the group consisting of B, C, and N to a surface of said base member, said first step and said second step being repeated alternately, wherein said first gas contains at least one kind selected from the group consisting of $N_2$, $NH_3$, and $N_2H_4$, wherein said second gas contains at least one kind selected from the group consisting of $N_2$, $NH_3$, and $N_2H_4$, wherein a first metal-based gas and a first non-metal-based gas are ejected in a reactor vessel through a plurality of different through holes of a feed pipe in said first step, said first metal-based gas and said first non-metal-based gas being mixed immediately after being ejected to said reactor vessel by rotating said feed pipe about its axis to form said first gas, and wherein a second metal-based gas and a second non-metal-based gas are ejected in said reactor vessel through said plurality of different through holes of said feed pipe in said second step, said second metal-based gas and said second non-metal-based gas being mixed immediately after being ejected to said reactor vessel by rotating said feed pipe about its axis to form said second gas.

2. The method for manufacturing a surface coated member according to claim 1, wherein said first gas further contains Al.

3. The method for manufacturing a surface coated member according to claim 1, wherein said first metal-based gas contains Ti and said first non-metal-based gas contains B, C, N, or O.

4. The method for manufacturing a surface coated member according to claim 1, wherein said second metal-based gas contains Al and said second non-metal-based gas contains B, C, or N.

* * * * *